(12) United States Patent
Sutton et al.

(10) Patent No.: US 8,975,895 B2
(45) Date of Patent: Mar. 10, 2015

(54) METHOD FOR CORRECTING MOTION-INDUCED PHASE ERRORS IN MAGNETIC RESONANCE IMAGING

(75) Inventors: Bradley Sutton, Savoy, IL (US); Anh Van, San Francisco, CA (US); Diego Hernando, Madison, WI (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 324 days.

(21) Appl. No.: 13/350,445

(22) Filed: Jan. 13, 2012

(65) Prior Publication Data

US 2013/0181712 A1 Jul. 18, 2013

(51) Int. Cl.
G01R 33/48 (2006.01)
G01R 33/563 (2006.01)
G01R 33/565 (2006.01)
G01R 33/567 (2006.01)

(52) U.S. Cl.
CPC .... *G01R 33/56341* (2013.01); *G01R 33/56509* (2013.01); *G01R 33/5676* (2013.01)
USPC .......................................... 324/314; 324/307

(58) Field of Classification Search
CPC .................. G01R 33/56341; G01R 33/56509; G01R 33/5676
USPC ................................................. 324/300–322
See application file for complete search history.

(56) References Cited

U.S. PATENT DOCUMENTS

2007/0249929 A1* 10/2007 Jeong et al. .................... 600/410
2012/0286777 A1* 11/2012 Frost et al. ..................... 324/307
2013/0229177 A1*  9/2013 Bammer et al. .............. 324/309

OTHER PUBLICATIONS

Van, Anh T., et al. "K-Space and Image-Space Combination for Motion-Induced Phase-Error Correction in Self-Navigated Multicoil Multishot DWI." Medical Imaging, IEEE Transactions on 28.11 (2009): 1770-1780.*

Van, Anh T., Diego Hernando, and Bradley P. Sutton. "Motion-induced phase error estimation and correction in 3D diffusion tensor imaging." Medical Imaging, IEEE Transactions on 30.11 (2011): 1933-1940.*

(Continued)

*Primary Examiner* — Melissa Koval
*Assistant Examiner* — Rishi Patel
(74) *Attorney, Agent, or Firm* — Quarles & Brady, LLP

(57) ABSTRACT

A method for correcting motion-induced phase errors in diffusion-weighted k-space data acquired with a magnetic resonance imaging (MRI) system is provided. The MRI system is directed to acquire the following data from an imaging volume: three-dimensional diffusion-weighted k-space data, three-dimensional diffusion-weighted navigator data, three-dimensional non-diffusion-weighted k-space data, and three-dimensional non-diffusion-weighted navigator data. Initial estimates of k-space shift values and a constant phase offset value are calculated using the three-dimensional diffusion-weighted navigator data and the three-dimensional non-diffusion-weighted navigator data. These initial k-space shift values and constant phase offset value are then updated by iteratively minimizing a cost function that relates the phase of the diffusion-weighted k-space data to the phase of the non-diffusion-weighted k-space data, as shifted by the initial k-space shift values and constant phase offset value. The diffusion-weighted k-space data is then corrected for motion-induced phase errors using the updated k-space shift values and constant phase offset value.

7 Claims, 2 Drawing Sheets

(56) References Cited

OTHER PUBLICATIONS

Van, A. T., D. C. Karampinos, and B. P. Sutton. "High resolution 3D multi-slab multi-shot spin echo diffusion-weighted imaging." 18th Annual Meeting of ISMRM, Stockholm, Sweden. 2010.*

Anderson, et al., Analysis and Correction of Motion Artifacts in Diffusion Weighted Imaging, Magnetic Resonance in Medicine, 1994, 32(3):379-387.

Atkinson, et al., Sampling and Reconstruction Effects Due to Motion in Diffusion-Weighted Interleaved Echo Planar Imaging, Magnetic Resonance in Medicine, 2000, 44(1):101-109.

Atkinson, et al., Nonlinear Phase Correction of Navigated Multicoil Diffusion Images, Magnetic Resonance in Medicine, 2006, 56(5):1135-1139.

Butts, et al., Isotropic Diffusion-Weighted and Spiral-Navigated Interleaved EPI for Routine Imaging of Acute Stroke, Magnetic Resonance in Medicine, 1997, 38(5):741-749.

Frank, et al., High Efficiency, Low Distortion 3D Diffusion Tensor Imaging with Variable Density Spiral Fast Spin Echoes (3D DW VDS RARE), Neuroimage, 2010, 49(2):1510-1523.

Jung, et al., 3D Diffusion Tensor MRI with Isotropic Resolution Using a Steady-State Radial Acquisition, J. Magn. Reson. Imaging, 2009, 29(5):1175-1184.

Li, et al., High-Resolution Diffusion-Weighted Imaging with Interleaved Variable-Density Spiral Acquisitions, Journal of Magnetic Resonance Imaging, 2005, 21(4):468-475.

Liu, et al., Self-Navigated Interleaved Spiral (SNAILS): Application to High-Resolution Diffusion Tensor Imaging, Magnetic Resonance in Medicine, 2004, 52(6):1388-1396.

Liu, et al., Simultaneous Phase Correction and SENSE Reconstruction for Navigated Multi-Shot DWI with Non-Cartesian k-space Sampling, Magnetic Resonance in Medicine, 2005, 54(6):1412-1422.

McNab, et al., 3D Steady-State Diffusion-Weighted Imaging With Trajectory Using Radially Batched Internal Navigator Echoes (TURBINE), Magnetic Resonance in Medicine, 2010, 63:235-242.

Miller, et al., Nonlinear Phase Correction for Navigated Diffusion Imaging, Magnetic Resonance in Medicine, 2003, 50:343-353.

Miller, et al., Steady-State Diffusion-Weighted Imaging of In Vivo Knee Cartilage, Magnetic Resonance in Medicine, 2004, 51:394-398.

Van, et al., K-Space and Image-Space Combination for Motion-Induced Phase-Error Correction in Self-Navigated Multicoil Multishot DWI, IEEE Transactions on Medical Imaging, 2009, 28(11):1770-1780.

Van, et al., K-space and Image Space Combination for Motion-Induced Phase Error Correction in 3D Diffusion-Weighted Imaging, Proc. Intl. Soc. Mag. Reson. Med., 2009, 17:1381.

Zhang, et al., 3D Self-Navigated Interleaved Spiral (3D-Snails) for DWI, Proc. Intl. Soc. Mag. Reson. Med., 2007, 15:9.

* cited by examiner

METHOD FOR CORRECTING MOTION-INDUCED PHASE ERRORS IN MAGNETIC RESONANCE IMAGING

BACKGROUND OF THE INVENTION

The field of the invention is systems and methods for magnetic resonance imaging ("MRI"). More particularly, the invention relates to systems and methods for correcting motion-induced phase errors in diffusion-weighted MRI.

Diffusion-weighted MRI is a powerful tool to evaluate the microstructure of tissues based on the diffusion of water molecules within those tissues. Because diffusion encoding is essentially the encoding of motion, any type of motion will be reflected in the received signal or, equivalently, the reconstructed image. It has been previously shown by A. W. Anderson and J. C. Gore, in "Analysis and Correction of Motion Artifacts in Diffusion Weighted Imaging," *Magn Reson Med*, 1994; 32:379-387, that coherent motion of an imaging object during the diffusion-encoding period results in phase errors in the reconstructed image. These motion-induced phase errors can be ignored in single-shot diffusion imaging when only a magnitude image is used, as is often the case in practice. However, single-shot imaging can only be used if the required resolution is relatively low, or if reduced field-of-view imaging is used so that a single-shot acquisition can be realized without much distortion. When high resolution is needed, however, such as for three-dimensional full brain diffusion-weighted imaging ("DWI"), the data acquisition readout window for a single-shot acquisition is so long that $T^*_2$ blurring or significant image distortion from magnetic field inhomogeneities are introduced into the resultant images. In these cases, a multi-shot acquisition is usually implemented. When multi-shot acquisitions are used, the k-space data are divided into multiple partitions, or shots, each of which is acquired in different excitations and acquisition windows. Therefore, different shots of the image acquisition carry different motion-induced phase errors. The differing phase errors, if not corrected, can result in significant artifacts in the final reconstruction. As a result, multi-shot acquisitions are always used in combination with some type of motion-induced phase error correction.

While many algorithms exist for the correction of motion-induced phase errors in two-dimensional DWI, motion-induced phase error correction in three-dimensional DWI is still under development. The difficulties associated with three-dimensional motion-induced phase error correction include the acquisition of a true three-dimensional navigator and the development of algorithms for phase error estimation and correction in three-dimensions. Realization of a true three-dimensional navigator with high enough resolution to capture the nonlinearity of the motion-induced phase errors is nontrivial, especially for pulse sequences that require short repetition times ("TR"), such as diffusion-weighted steady-state imaging. Regarding phase error estimation and correction, several studies have tried to extend the existing two-dimensional motion-induced phase error correction methods. For example, J. Zhang, et al., in "3D Self-Navigated Interleaved Spiral (3D-SNAILS) for DWI," 15*th Annual Meeting of ISMRM, Berlin, Germany*, 2007; p. 9, described extending the two-dimensional self-navigated interleaved spiral ("SNAILS") to three dimensions, and L. R. Frank, et al., in "High Efficiency, Low Distortion 3D Diffusion Tensor Imaging with Variable Density Spiral Fast Spin Echoes (3D DW VDS RARE)," *Neuroimage*, 2010; 49:1510-1523, described extending a simultaneous phase correction and SENSE reconstruction approach to three-dimensions. However, these extensions of existing two-dimensional techniques to three dimensions included limitations that restricted their practical use. In the case of the SNAILS technique, the performance of the resulting algorithm was trajectory dependent, thereby limiting its practical use for three-dimensional acquisitions, and in many cases, the image reconstruction time was too long for practical use.

If the only source of motion-induced phase errors is rigid body motion, the resulting phase errors in the reconstructed image are linear, which means that the phase errors are equivalent to shifts and constant phase-offsets in k-space. Utilizing this idea, a time-efficient motion-induced phase error correction method was recently introduced by Y. Jung, et al., in "3D Diffusion Tensor MRI with Isotropic Resolution Using a Steady-State Radial Acquisition," *J Magn Reson Imaging*, 2009; 29:1175-1184. In this method, the magnitude peaks of the navigator k-space data were used to estimate k-space shifts and phase offsets induced by motion-induced phase errors. The corrupted data were then corrected in k-space correspondingly. However, because the navigator data was only a one-dimensional radial line through the center of k-space, the phase error estimation and correction was only one-dimensional. Furthermore, the performance of this method depended on the resolution of the navigators in k-space. Results from Y. Jung, et al., show significant residual phase errors after correction that had to be further taken into account by discarding data.

Another algorithm for correcting motion-induced phase errors induced by rigid body motion referred to as the three-dimensional k-space and image space correction technique ("3D KICT") was described recently by A. T. Van, et al., in "K-Space and Image Space Combination for Motion-Induced Phase Error Correction in 3D Diffusion-Weighted Imaging," 17*th Annual Meeting of ISMRM, Honolulu, Hi.*, 2009; p. 1381. In this method, k-space shifts are estimated as by unwrapping and fitting linear phase errors to one-dimensional linear functions in image space separately along the x-, y-, and z-directions. The phase of the peak k-space navigator data point is then used for the constant phase offset estimation. The correction is then performed in k-space, resulting in k-space trajectories and data that are corrected for shot-dependent phase errors. Unlike the previously discussed algorithm proposed by Jung, et al., only the performance of the constant phase offset estimation is dependent on the resolution in k-space of the navigator. The k-space shift estimation is independent of the k-space resolution of the navigator, as it is performed as a slope estimation in image space. However, this linear fitting estimation method is highly sensitive to noise, especially in the case of small phase errors.

It would therefore be desirable to provide a method for correcting motion-induced phase errors in three-dimensions, and in which the method provides clinically practical image reconstruction times and is generally insensitive to noise.

SUMMARY OF THE INVENTION

The present invention overcomes the aforementioned drawbacks by providing a method for correcting motion-induced phase errors in three-dimensional diffusion-weighted k-space data.

It is an aspect of the invention to provide a method for correcting motion-induced phase errors in diffusion-weighted k-space data acquired with a magnetic resonance imaging ("MRI") system. The MRI system is directed to acquire, from an imaging volume: three-dimensional diffusion-weighted k-space data, three-dimensional diffusion-weighted navigator data, three-dimensional non-diffusionweighted k-space data, and three-dimensional non-diffusion-weighted navigator data. Initial k-space shift values and an initial constant phase offset value are then calculated using the three-dimensional diffusion-weighted navigator data and the three-dimensional non-diffusion-weighted navigator data. The k-space shift values and the constant phase offset value updated by iteratively minimizing a cost function that relates the phase of the diffusion-weighted k-space data to a phase of the non-diffusion-weighted k-space data as shifted by the initial k-space shift values and initial constant phase offset value. The updated k-space shift values and constant phase offset value are then used to correct the diffusion-weighted k-space data for motion-induced phase errors.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
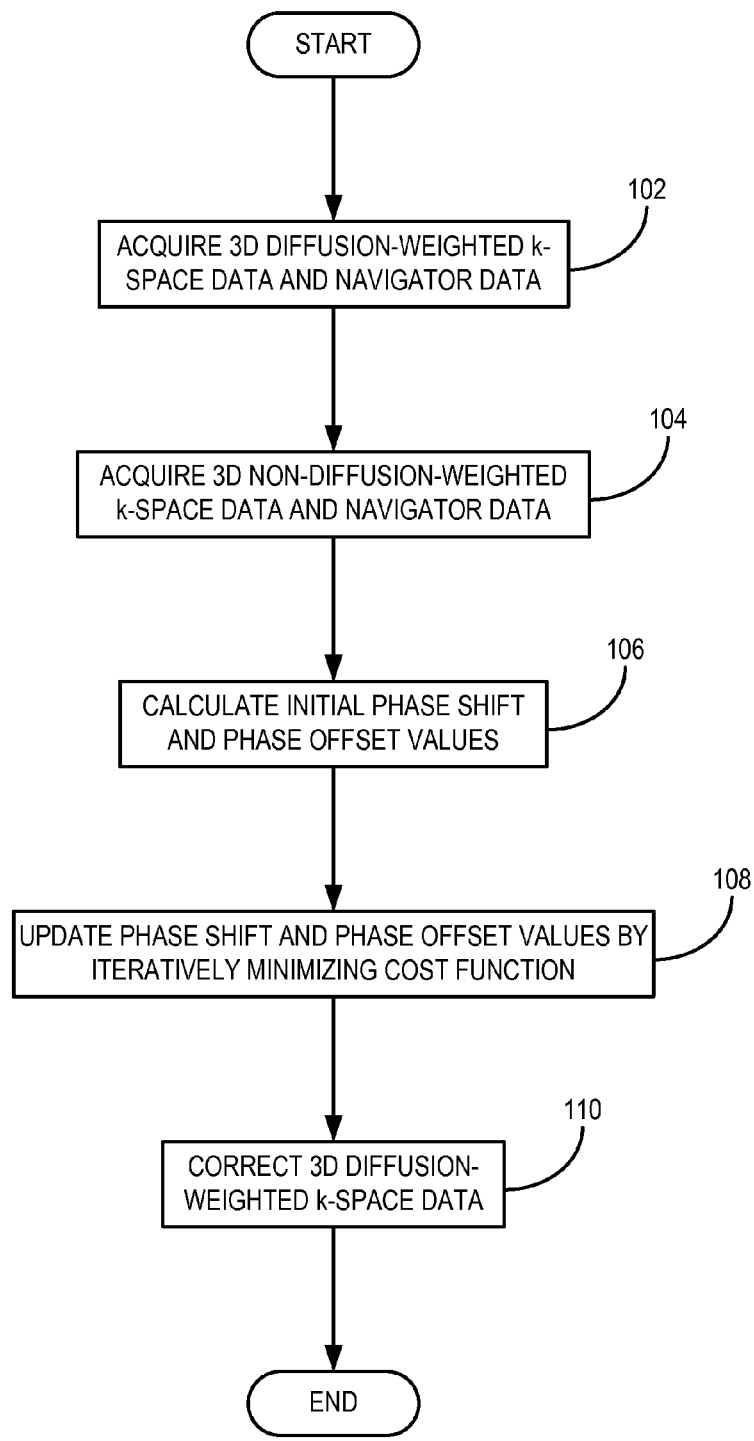
FIG. 1 is a flowchart setting forth the steps of an example of a method for correcting motion-induced phase errors in three-dimensional diffusion-weighted k-space data.

The need to detect small brain lesions and to reduce partial volume effects in the measurement of diffusion metrics has made high resolution three-dimensional diffusion-tensor imaging ("DTI") a research focus in diffusion acquisition methodology. For example, three-dimensional DTI is beneficial over two-dimensional DTI because three-dimensional DTI has the potential for achieving higher signal-to-noise ratio ("SNR") at higher spatial resolutions or higher b-values. The method of the present invention provides a solution for one of the critical challenges that must be overcome to enable reliable and robust three-dimensional DTI: the correction of motion-induced phase errors in three dimensions. Due to the long data readout times, three-dimensional full brain DTI requires multi-shot techniques; therefore, it is crucial that a robust motion-induced phase error correction algorithm be used when reconstructing images from the acquired data.

Under the assumption of rigid body motion, the motion-induced phase errors in image space for fully sampled navigator data from one shot of a multi-shot acquisition can be modeled as:

$$\tilde{I}_b(r) = I_b(r) e^{j[(a \cdot r) + \alpha_0]} \tag{1}$$

where $\tilde{I}_b(r)$ is the corrupted diffusion-weighted complex image; $I_b(r)$ is the desired, uncorrupted diffusion-weighted complex image; a is the vector of the slopes of the linear phase error; $\alpha_0$ is the constant offset of the linear phase error; and r is a spatial position vector.

Because motion-induced phase errors are the result of motions that occur during the diffusion encoding, the non-diffusion-weighted images contain no motion-induced phase errors. Furthermore, without motion-induced phase errors and under the assumption of Gaussian diffusion, diffusion encoding only causes signal attenuation; therefore, the non-diffusion-weighted image and the ideal motion-induced phase error-free diffusion-weighted image can be respectively modeled as:

$$I_0(r) = |I_0(r)| e^{j\phi(r)} \tag{2}$$

$$I_b(r) = |I_b(r)| e^{j\phi(r)} \tag{3}$$

where $I_0(r)$ is the complex non-diffusion-weighted image; $\phi(r)$ is the phase of the non-diffusion-weighted image (including the phase of the receiver coil, magnetic-susceptibility-induced phase, eddy-current-induced phase), which is also the phase of the ideal motion-induced phase error-free diffusion-weighted image, ignoring eddy-current effects caused by diffusion gradients; and $|\ldots|$ is the magnitude operation.

From Eqns. (1)-(3) and the assumption of additive white Gaussian noise, the maximum likelihood ("ML") estimate of $\{a, \alpha_0\}$ is obtained by minimizing the following cost function:

$$R(a, a_0) = \sum_r |\tilde{I}_b(r) - |I_b(r)| e^{j[\angle I_0(r) + (a \cdot r) + a_0]}|^2; \tag{4}$$

where $\angle(\ldots)$ is the phase extraction operation.

Minimizing $R(a, \alpha_0)$ in Eqn. (4) is a nonlinear least squares ("NLLS") optimization problem, which does not generally have a closed-form solution; therefore, the minimization may be solved iteratively using a descent-based algorithm. However, because the cost function $R(a, \alpha_0)$ is also non-convex, it generally contains multiple local minima, which might prevent descent-based algorithms from converging to the global minimum. To guarantee convergence, a proper initialization for $\{a, \alpha_0\}$ is provided.

Because the slopes of a linear phase in image space are the shifts in k-space, and because the offset of a linear phase in image space is the constant phase in k-space, $\{a, \alpha_0\}$ can be initialized as the shifts from the k-space origin and the phase of the maximum magnitude navigator k-space data point, respectively. To remove the possible k-space shifts and phase offset due to field inhomogeneities that exist in both the diffusion-weighted data and the non-diffusion-weighted data, subtraction from the shifts and offsets of the non-diffusion-weighted data is performed for the initialization. The initialization process can be summarized as follows:

$$k_0^* = \underset{k}{\mathrm{argmax}} |S_0(k)|; \tag{5}$$

$$k_b^* = \underset{k}{\mathrm{argmax}} |S_b(k)|; \tag{6}$$

$$a^{init} = 2\pi(k_b^* - k_0^*); \tag{7}$$

$$a_0^{init} = \angle S_b(k_b^*) - \angle S_0(k_0^*); \tag{8}$$

where $S_0$ and $S_b$ are the received non-diffusion-weighted and diffusion-weighted navigator k-space data, respectively. With this initialization, the minimization of $R(a, \alpha_0)$ in Eqn. (4) may be done using, for example, an NLLS minimization with a trust-region-reflective algorithm.

After the motion-induced phase errors are estimated, the acquired k-space data are corrected by shifting the k-space trajectory and applying the constant phase offset to the k-space data as follows:

$$k_{corr} = k - \frac{a^*}{2\pi};\quad(9)$$

$$S_{corr}(k_{corr}) = S(k)e^{-j\alpha_0^*};\quad(10)$$

where k is the designed k-space trajectory, $k_{corr}$ is the actual k-space trajectory under the effects of motion-induced phase errors, S is the received k-space data affected by motion-induced phase errors, $S_{corr}$ is the corrected k-space data, and a* and $\alpha^*_0$ are the optimal slopes and constant offset minimizing Eqn. (4), respectively.

Because motion-induced phase errors are caused by motions of the imaging object between the diffusion encoding gradients, they are independent of the receiver coils. This result means that motion-induced phase errors in the data collected by different receiver coils are the same; thus, to handle a multi-coil acquisition, the cost function in Eqn. (4) is modified to:

$$R(a, a_0) = \sum_c \sum_r \left| |I_b^c(r)| - |I_b^c(r)| e^{j[L I_0^c(r) + (a \cdot r) + a_0]} \right|^2;\quad(11)$$

where c is the receiver coil index. The initializations for a and $\alpha_0$ now are:

$$k_0^*(c) = \underset{k}{\operatorname{argmax}} |S_0^c(k)|;\quad(12)$$

$$k_b^*(c) = \underset{k}{\operatorname{argmax}} |S_b^c(k)|;\quad(13)$$

$$a^{init} = \frac{2\pi}{N_c} \sum_{c=0}^{N_c-1} (k_b^*(c) - k_0^*(c));\quad(14)$$

$$a_0^{init} = \frac{1}{N_c} \sum_{c=0}^{N_c-1} (L S_b^c(k_b^*(c)) - L S_0^c(k_0^*(c)));\quad(15)$$

where $N_c$ is the total number of receiver coils and c is the coil index.

After the error estimation, the correction is performed in the same way as for the single coil acquisition by correcting the k-space trajectories and data from all receiver coils simultaneously.

Referring now to FIG. 1, a flowchart setting forth an example of a method for correcting motion-induced phase errors in three-dimensional diffusion-weighted image data acquired with an MRI system is illustrated. The method begins with the acquisition of diffusion-weighted k-space data from a three-dimensional imaging volume, as indicated at step 102. Also, three-dimensional, diffusion-weighted navigator data is acquired substantially contemporaneously with the diffusion-weighted k-space data. The k-space data is preferably acquired using a multi-shot pulse sequence for data acquisition. An example of a three-dimensional navigator includes a stack of low-resolution single-shot constant density spirals; however, other three-dimensional navigators may also be used. As is common with diffusion-weighted imaging techniques, non-diffusion-weighted k-space data is also acquired from the imaging volume, as indicated at step 104. Likewise, three-dimensional, non-diffusion-weighted navigator data is acquired substantially contemporaneously with the non-diffusion-weighted k-space data. The navigator data acquired in steps 102 and 104 will be used to estimate the k-space shifts used for correcting the acquired k-space data using the aforementioned minimization method. As noted above, steps 102 and 104 can be performed using an array of receiver coil elements and an appropriate parallel imaging technique.

By way of example, a three-dimensional diffusion-weighted spin-echo ("DWSE") sequence with navigators may be used to acquire the diffusion-weighted k-space data and navigator data, as well as the non-diffusion weighted k-space data and navigator data. The choice of k-space trajectory for the data acquisition generally does not affect the accuracy of the error estimation and correction; rather, the provided method is applicable for arbitrary k-space trajectories, including Cartesian trajectories and non-Cartesian trajectories such as spiral or radial trajectories. By way of example, a k-space trajectory composed of a stack of six-shot constant density spirals may be used for image acquisition.

To improve data acquisition efficiency, a multi-slab three-dimensional acquisition may be used. With such an acquisition scheme, oversampling and overlapping of slabs and interleaving of odd and even slabs may be used to mitigate slab-boundary artifacts.

To mitigate motion-induced phase errors resulting from non-rigid body motion, such as cardiac-induced pulsation, and to enhance the validity of the rigid body motion assumption, cardiac gating may be employed during data acquisition. This cardiac gating helps to reduce the phase-error correction problem to a much faster linear phase correction and, therefore, may also allow for the use of lower-resolution navigators. Although cardiac gating reduces the efficiency of the data acquisition, it is highly advantageous because cardiac-induced pulsation results in nonlinear motion-induced phase errors and unrecoverable signal loss, especially during systole. A three-dimensional multislab acquisition with multiple readouts per cardiac cycle may be used to mitigate the reduction in data acquisition efficiency associated with cardiac gating.

The k-space data can be acquired with or without parallel imaging. When parallel imaging is used, the non-diffusion-weighted k-space data (zero b-value acquisition) is preferably still fully encoded so that the sensitivity maps can be reliably extracted therefrom.

After the requisite k-space and navigator data has been acquired, an estimation of the motion-induced phase errors is performed. In general, these errors are estimated by minimizing a cost function, such as the cost function in Eqn. (4), using the navigator data. This minimization problem must first be initialized to allow an efficient and accurate convergence to the desired solution. Thus, as indicated at step 106, the minimization problem is initialized by selecting initial values for k-space shifts associated with the motion-induced phase shifts and constant phase offset. For example, k-space shifts associated with the motion-induced phase shifts are initialized using Eqn. (7) or Eqn. (14), and the constant phase offset is initialized using Eqn. (8) or Eqn. (15). After the initial values are selected, k-space shift values and constant phase offset values are estimated by minimizing the appropriate cost function, such as the cost function in Eqn. (4), as indicated at step 108. The estimated k-space shifts and constant phase offset are then used to correct the acquired k-space data, as indicated at step 110. For example, the k-space data values are corrected in accordance with Eqns. (9) and (10).

The present invention provides a method for three-dimensional motion-induced phase error correction that is truly three-dimensional and provides robust correction of moderate motion-induced phase errors from rigid body motion. This motion-correction method also allows for a flexible choice of reconstruction method after data and k-space trajectory correction. As compared to a nonlinear phase error correction algorithm, the provided method gives comparable correction results when the acquisition is cardiac-gated at a shorter reconstruction time.

Figure 2:
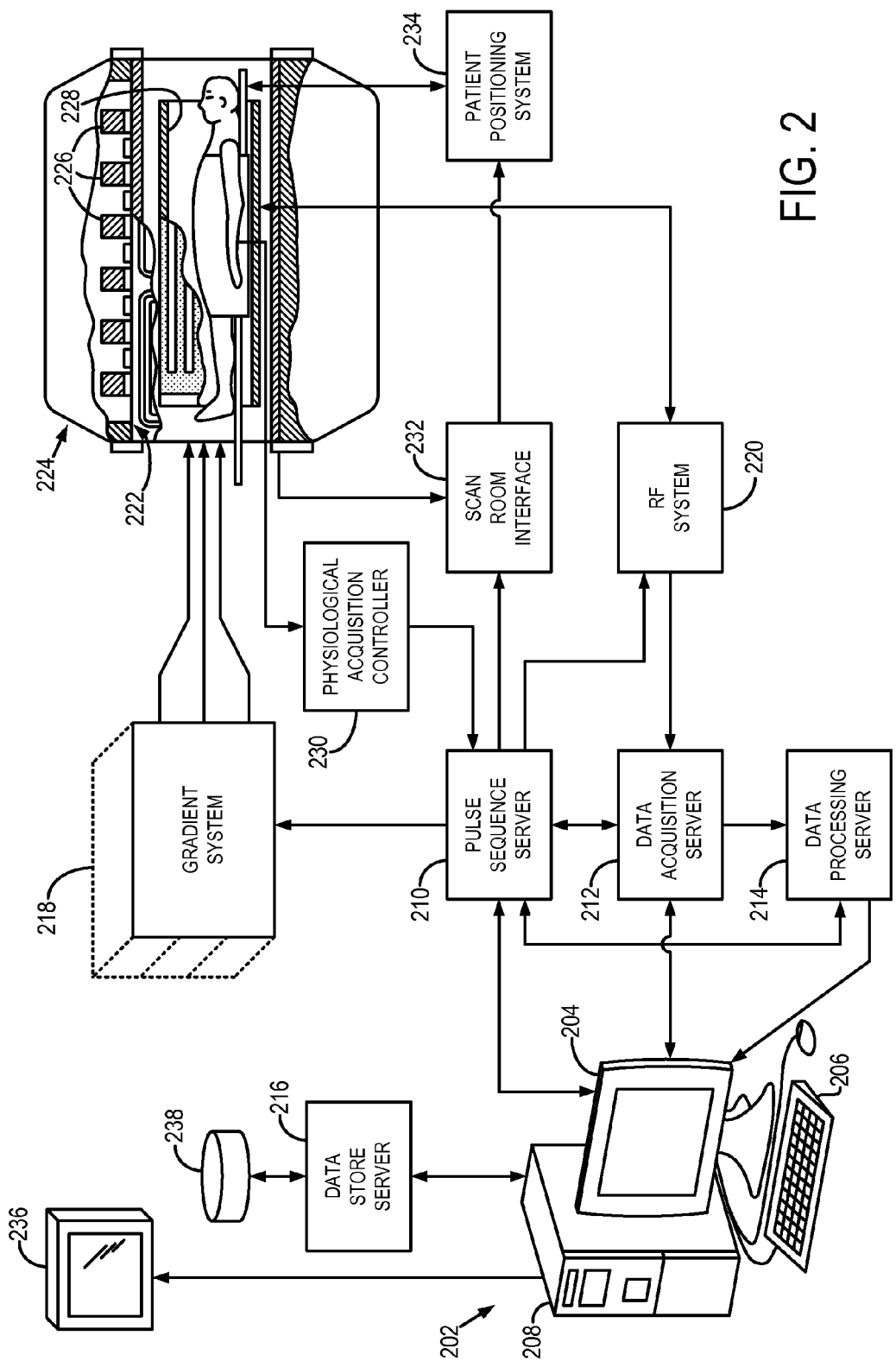
FIG. 2 is a block diagram of an example of a magnetic resonance imaging ("MRI") system.

Referring particularly now to FIG. 2, an example of a magnetic resonance imaging ("MRI") system 200 is illustrated. The MRI system 200 includes a workstation 202 having a display 204 and a keyboard 206. The workstation 202 includes a processor 208, such as a commercially available programmable machine running a commercially available operating system. The workstation 202 provides the operator interface that enables scan prescriptions to be entered into the MRI system 200. The workstation 202 is coupled to four servers: a pulse sequence server 210; a data acquisition server 212; a data processing server 214; and a data store server 216. The workstation 202 and each server 210, 212, 214, and 216 are connected to communicate with each other.

The pulse sequence server 210 functions in response to instructions downloaded from the workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding MR signals. The gradient coil assembly 222 forms part of a magnet assembly 224 that includes a polarizing magnet 226 and a whole-body RF coil 228.

RF excitation waveforms are applied to the RF coil 228, or a separate local coil (not shown in FIG. 2), by the RF system 220 to perform the prescribed magnetic resonance pulse sequence. Responsive MR signals detected by the RF coil 228, or a separate local coil (not shown in FIG. 2), are received by the RF system 220, amplified, demodulated, filtered, and digitized under direction of commands produced by the pulse sequence server 210. The RF system 220 includes an RF transmitter for producing a wide variety of RF pulses used in MR pulse sequences. The RF transmitter is responsive to the scan prescription and direction from the pulse sequence server 210 to produce RF pulses of the desired frequency, phase, and pulse amplitude waveform. The generated RF pulses may be applied to the whole body RF coil 228 or to one or more local coils or coil arrays (not shown in FIG. 2).

The RF system 220 also includes one or more RF receiver channels. Each RF receiver channel includes an RF amplifier that amplifies the MR signal received by the coil 228 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I_2+Q^2} \qquad (16);$$

and the phase of the received MR signal may also be determined:

$$\varphi = \tan^{-1}\left(\frac{Q}{I}\right). \qquad (17)$$

The pulse sequence server 210 also optionally receives patient data from a physiological acquisition controller 230. The controller 230 receives signals from a number of different sensors connected to the patient, such as electrocardiograph ("ECG") signals from electrodes, or respiratory signals from a bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized MR signal samples produced by the RF system 220 are received by the data acquisition server 212. The data acquisition server 212 operates in response to instructions downloaded from the workstation 202 to receive the real-time MR data and provide buffer storage, such that no data is lost by data overrun. In some scans, the data acquisition server 212 does little more than pass the acquired MR data to the data processor server 214. However, in scans that require information derived from acquired MR data to control the further performance of the scan, the data acquisition server 212 is programmed to produce such information and convey it to the pulse sequence server 210. For example, during prescans, MR data is acquired and used to calibrate the pulse sequence performed by the pulse sequence server 210. Also, navigator signals may be acquired during a scan and used to adjust the operating parameters of the RF system 220 or the gradient system 218, or to control the view order in which k-space is sampled. In all these examples, the data acquisition server 212 acquires MR data and processes it in real-time to produce information that is used to control the scan.

The data processing server 214 receives MR data from the data acquisition server 212 and processes it in accordance with instructions downloaded from the workstation 202. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 214 are conveyed back to the workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the workstation 202. The workstation 202 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for correcting motion-induced phase errors in diffusion-weighted k-space data acquired with a magnetic resonance imaging (MRI) system, the steps of the method comprising:
   a) directing the MRI system to:
      i) acquire three-dimensional diffusion-weighted k-space data from an imaging volume;

ii) acquire three-dimensional diffusion-weighted navigator data from the imaging volume;
iii) acquire three-dimensional non-diffusion-weighted k-space data from the imaging volume;
iv) acquire three-dimensional non-diffusion-weighted navigator data from the imaging volume;
b) calculating k-space shift values and a constant phase offset value using the three-dimensional diffusion-weighted navigator data acquired in step a)ii) and the three-dimensional non-diffusion-weighted navigator data acquired in step a)iv);
c) updating the k-space shift values and the constant phase offset value calculated in step b) by iteratively minimizing a cost function that relates a phase of the diffusion-weighted k-space data acquired in step a)i) to a phase of the non-diffusion-weighted k-space data acquired in step a)iii) as shifted by the k-space shift values and constant phase offset value calculated in step b); and
d) correcting the diffusion-weighted k-space data acquired in step a)i) for motion-induced phase errors using the k-space shift values and constant phase offset value updated in step c).

2. The method as recited in claim 1 in which step b) includes calculating initial k-space shift values by calculating a difference between a k-space location associated with a maximum magnitude of the three-dimensional diffusion-weighted navigator data acquired in step a)ii) and a k-space location associated with a maximum magnitude of the three-dimensional non-diffusion-weighted navigator data acquired in step a)iv).

3. The method as recited in claim 1 in which step b) includes calculating the constant phase offset value by calculating a difference between a phase of k-space location associated with a maximum value of the three-dimensional diffusion-weighted navigator data acquired in step a)ii) and a phase of a k-space location associated with a maximum value of the three-dimensional non-diffusion-weighted navigator data acquired in step a)iv).

4. The method as recited in claim 1 in which step a) includes acquiring the three-dimensional diffusion-weighted k-space data, the three-dimensional diffusion-weighted navigator data, the three-dimensional non-diffusion-weighted k-space data, and the three-dimensional non-diffusion-weighted navigator data using a parallel imaging technique and an array of radio frequency (RF) receiver coils.

5. The method as recited in claim 4 in which step b) includes calculating initial k-space shift values by:
i) calculating, for each receiver coil in the array of RF receiver coils, a difference between a k-space location associated with a maximum magnitude of the three-dimensional diffusion-weighted navigator data acquired in step a)ii) with a given receiver coil and a k-space location associated with a maximum magnitude of the three-dimensional non-diffusion-weighted navigator data acquired in step a)iv) with the given receiver coil; and
ii) calculating a sum of the differences calculated in step b)i).

6. The method as recited in claim 1 in which step b) includes calculating the constant phase offset value by:
i) calculating, for each receiver coil in the array of RF receiver coils, a difference between a phase of a k-space location associated with a maximum value of the three-dimensional diffusion-weighted navigator data acquired in step a)ii) with a given receiver coil and a phase of a k-space location associated with a maximum value of the three-dimensional non-diffusion-weighted navigator data acquired in step a)iv) with the given receiver coil; and
ii) calculating a sum of the differences calculated in step b)i).

7. The method as recited in claim 1 in which step a) includes acquiring the three-dimensional diffusion-weighted k-space data, the three-dimensional diffusion-weighted navigator data, the three-dimensional non-diffusion-weighted k-space data, and the three-dimensional non-diffusion-weighted navigator data using cardiac gating to mitigate non-linear motion-induced phase errors.

* * * * *